(12) United States Patent
Sevalia et al.

(10) Patent No.: US 6,356,122 B2
(45) Date of Patent: *Mar. 12, 2002

(54) CLOCK SYNTHESIZER WITH PROGRAMMABLE INPUT-OUTPUT PHASE RELATIONSHIP

(75) Inventors: Piyush Sevalia, Sunnyvale, CA (US); J. Ken Fox, Bothell, WA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/366,897

(22) Filed: Aug. 4, 1999

Related U.S. Application Data
(60) Provisional application No. 60/095,469, filed on Aug. 5, 1998.

(51) Int. Cl.[7] .............................................. H03B 21/00
(52) U.S. Cl. ........................ 327/105; 327/276; 327/299
(58) Field of Search ................................. 327/291, 105, 327/158, 276, 299

(56) References Cited

U.S. PATENT DOCUMENTS

| | | | |
|---|---|---|---|
| 4,868,513 A | * 9/1989 | Piercy et al. | ................ 328/134 |
| 5,446,867 A | * 8/1995 | Young et al. | ................ 395/550 |
| 5,687,202 A | * 11/1997 | Eitrheim | ...................... 375/376 |
| 5,926,053 A | * 7/1999 | McDermott et al. | ......... 327/298 |
| 5,933,032 A | 8/1999 | Shah et al. | .................. 327/334 |
| 5,936,451 A | * 8/1999 | Phillips et al. | ............... 327/285 |
| 5,936,977 A | 8/1999 | Churchill et al. | .............. 714/26 |
| 6,043,717 A | * 3/2000 | Kurd | ........................... 331/17 |

OTHER PUBLICATIONS

Cypress RoboClockII™ CY7B994V/CY7B993V, "High–Speed Multi–Phase PLL Clock Buffer", December 1998, p. 1.

Cypress CY2308, "3.3V Zero Delay Buffer", Jun. 27, 1997, pp. 1–7.

* cited by examiner

*Primary Examiner*—Toan Tran
*Assistant Examiner*—Cassandra Cox
(74) *Attorney, Agent, or Firm*—Christopher P. Maiorana, P.C.

(57) ABSTRACT

A circuit comprising an oscillator, a reference path, and a feedback path. The oscillator may have a reference input receiving a reference signal, a feedback input receiving a feedback signal, and an output. The reference path may provide the reference signal from a reference clock input. The feedback path may provide the feedback signal from the oscillator loop output. At least one of the reference path and the feedback path comprises a programmable delay circuit.

20 Claims, 2 Drawing Sheets

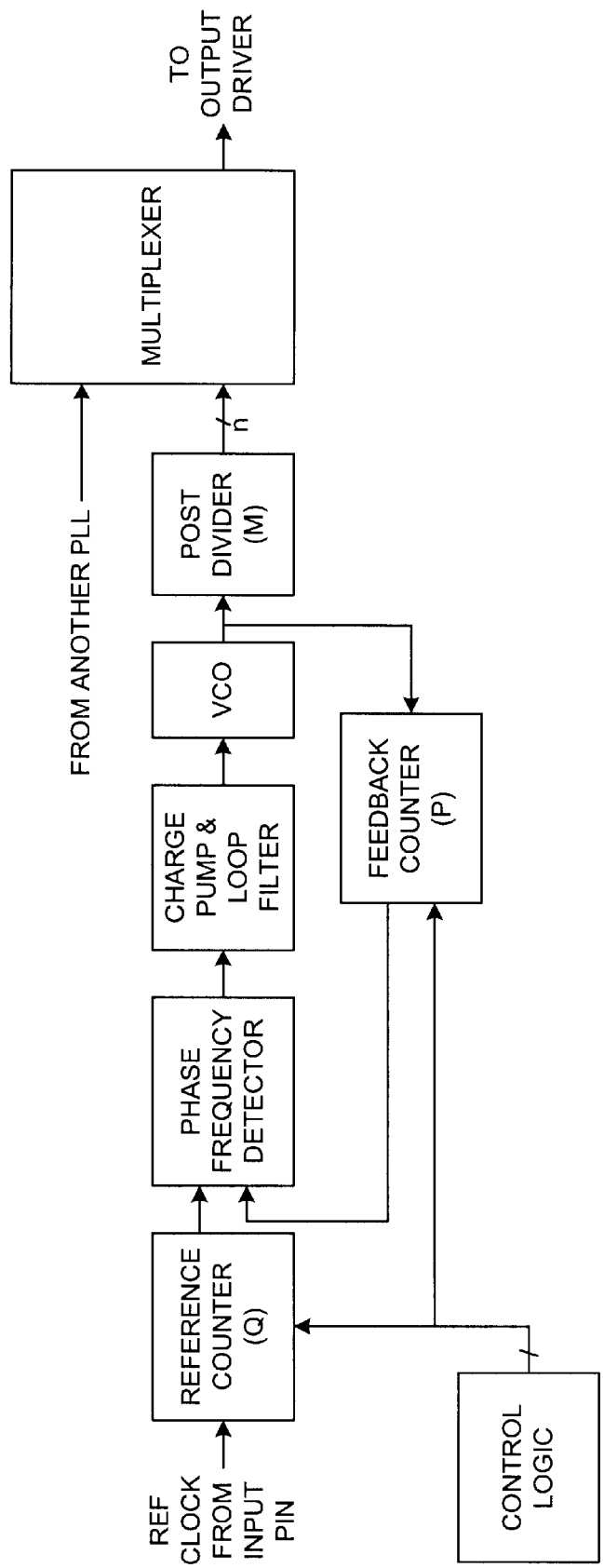
FIG. 1
(CONVENTIONAL)

CLOCK SYNTHESIZER WITH PROGRAMMABLE INPUT-OUTPUT PHASE RELATIONSHIP

This application claims the benefit of U.S. Provisional Application No. 60/095,469, filed Aug. 5, 1998, which is hereby incorporated by reference in its entirety.

FIELD OF THE INVENTION

The present invention relates to a clock synthesizer with a programmable input-output phase relationship generally and, more particularly, to a PLL-based clock synthesizer with a programmable input-output phase relationship for generating output frequencies based on a reference clock input.

BACKGROUND OF THE INVENTION

A PLL-based clock synthesizer generates output frequencies based on a reference clock input. The output clock frequency usually has no integral relationship (i.e., the ratio of the output clock frequency to an input clock frequency (or vice-versa) is an integer) to the input clock frequency. However, the input and output clocks are related by the relationship that there are Q cycles of the input clock for every P cycles of the output clock, where P and Q are integers. In some cases, it may be useful to have a known phase relationship between the input and output clocks. This is most often the case when either P/Q or Q/P is an integer, but that is not always required. The input-output delay depends on the difference between the delay of the logic in the reference path and the delay in the logic of the output path (which begins at the phase detector inputs, where the phase error is zero). The logic delays are delays through multiplexers, counters, post-dividers, etc.

The phase relationship in a zero-delay buffer may depend on the location of a tap in the feedback path in the ring oscillator. Additionally, zero-delay buffers usually have dividers either in the reference path or the feedback path. Thus, zero-delay buffers tend to be less flexible than a PLL as a clock generator. FIG. 1 illustrates a block diagram of a conventional zero-delay buffer architecture.

Conventional method(s) have the disadvantages of unpredictable input-output phase relationship and/or less flexibility. However, many applications for clock synthesizers benefit from a predictable input-output phase relationship, when the output frequency is a multiple of the input frequency. The present invention enjoys particular advantages in applications where a predictable input-output phase relationship is desired, particularly where the output frequency is an integral or one-half an integral multiple of the input frequency.

SUMMARY OF THE INVENTION

The present invention concerns a circuit comprising an oscillator, a reference path, and a feedback path. The oscillator may have a reference input receiving a reference signal, a feedback input receiving a feedback signal, and an output. The reference path may provide the reference signal from a reference clock input. The feedback path may provide the feedback signal from the oscillator loop output. At least one of the reference path and the feedback path comprises a programmable delay circuit.

The objects, features and advantages of the present invention include providing a clock synthesizer that may (i) implement a programmable input-output phase relationship, (ii) provide user programmable inputs for a programmable phase relationship and/or (iii) implement a programmable phase relationship in reference and/or feedback paths that may implement an oscillator in a phase locked loop.

BRIEF DESCRIPTION OF THE DRAWINGS

These and other objects, features and advantages of the present invention will be apparent from the following detailed description and the appended claims and drawings in which:

FIG. 1 is a block diagram of a conventional buffer; and

DETAILED DESCRIPTION OF THE PREFERRED EMBODIMENTS

Figure 2:
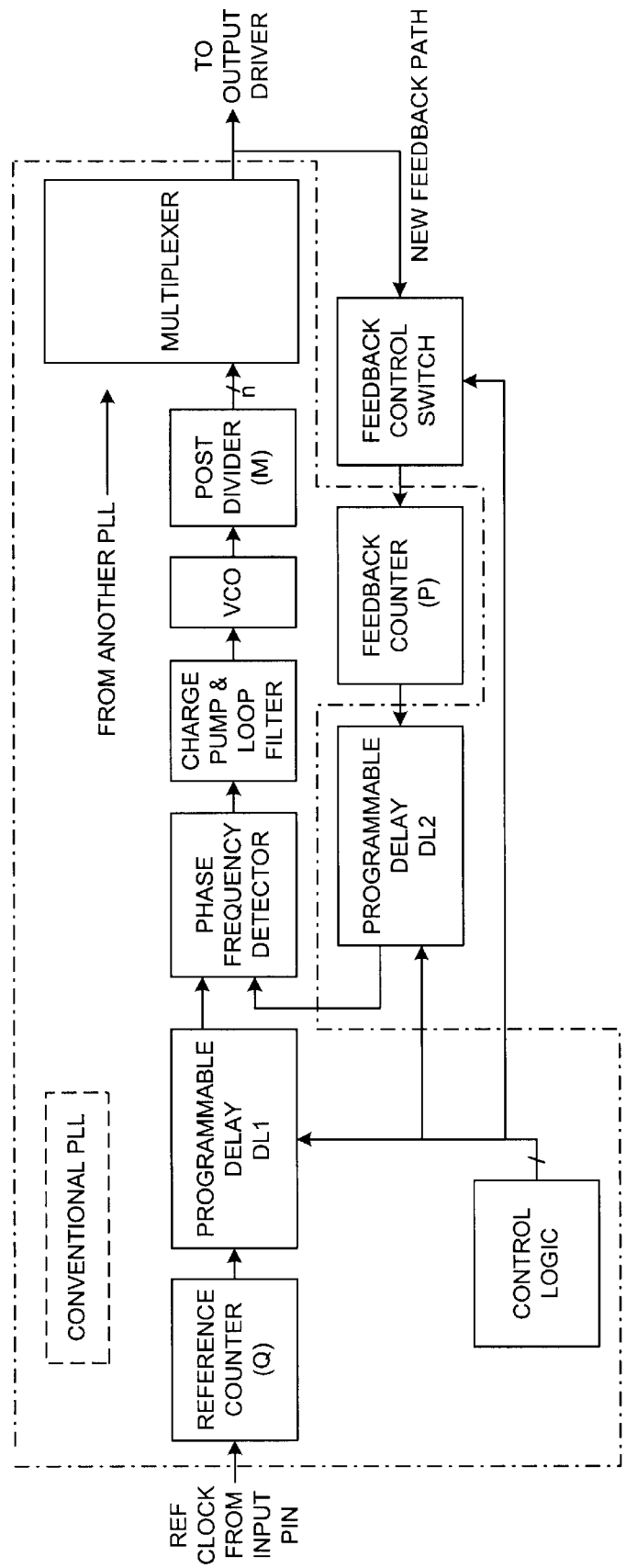
FIG. 2 is a block diagram of a preferred embodiment of the present invention.

The present invention concerns applications which use a programmable delay circuit (or other, similarly configurable PLL-based clock generator, such as a serially configurable device) where the input-output phase relationship is dependent on the values of the internal counters and the multiplexers in the output path, which in turn are dependent on the specific configuration of the device. Program and/or configuration information may be stored in a conventional nonvolatile or volatile memory, such as a read only memory (ROM), programmable read-only memory (PROM), erasable and programmable read-only memory (EPROM), electrically erasable programmable read-only memory (EEPROM), flash memory, random access memory (RAM, which may be dynamic RAM or static RAM), nonvolatile RAM, etc. The memory should be sufficiently large to store all the desired frequency and configuration data (e.g., approximately 2K bits, but could be more in particular design applications). Configuration data may refer to programmed data bits, the values of which result in control signals controlling one or more of the following circuit parameters: voltage controlled oscillator (vCo) gain, output buffer drive strength, delay lengths, phase comparator boundaries, charge pump strength, counter reset values, input/reference signal source, etc.

The present invention advantageously employs one or more of the following new features:

(a) If the reference clock input is an electrical clock signal, the input-output phase relationship can be made user-programmable, through programmable memory, Serial Interface, or hardware inputs, and thus the output clock can either lead or lag behind the input clock. Ultimately, the user-programmable input-output phase relationship provides a predictable input-output delay.

(b) When the output clock is a multiple of the input clock, or vice versa, and the multiplier is either an integral number (×1, ×3, ×7, etc.) or one-half an integral number (2½, 3½, 6½, etc.), then the delay between the input and output clock rising edges (when they are expected to be aligned) can be programmed to be a predictable number, including zero. Additionally, other relationships between the input clock and the output clock (e.g., 5 output clocks to 4 input clocks) may be implemented. This ensures that when the input and output clocks have rising edges (e.g., in the case of a rising edge-aligned PLL), there is predictable delay between these rising edges. The same concept can also be applied to falling edges (e.g., in the case of a PLL, which aligns falling edges). This feature may be unique to PLL-based clock generators, since they have counters in both the reference and feedback paths (e.g., rising to falling edge aligned).

In a PLL-based clock generator, any of the following may be sources of delay as a signal goes from input to output:

(a) Delay from input pin to input of reference counter, T1

(b) Delay through the (optional) reference counter, T2

(c) Delay through the oscillator or PLL, T3

(d) Delay through the (optional) post-divider, T4

(e) Delay through the (optional) output multiplexer, T5

(f) Delay from output multiplexer to pin, T6

In order for the output signal to be in phase with the input signal (where applicable), these delays should be eliminated (noting that an output signal 360° out of phase with the input signal is effectively in phase, and thus, the delays resulting in a 360° out of phase output signal are effectively eliminated). When the input-output phase relationship needs to be predictable, one should compensate for the above delays in a predictable manner for a particular configuration of a clock generator.

The present invention therefore comprises (a) one or more actual delay blocks, (b) a feedback path, and (c) control logic which controls these delay blocks and feedback path, as indicated in FIG. 2.

Delay generation in the present invention may be done through conventional delay lines, or through RC circuits. Delay compensation may be performed with either of at least two techniques, described below.

(1) Feedback from the VCO:

One or more programmable delay blocks (e.g., DL1 and/or DL2 in FIG. 2) may be placed in one or more input paths to the PLL. For example, one programmable delay circuit may be in a reference path (e.g., between [i] a reference clock input and/or reference counter and [ii] a phase and/or frequency detector in the PLL). Alternatively and/or in addition, a programmable delay circuit may be in a feedback path (e.g., from [i] the output of a VCO or VCO output divider [identified as a "post divider" in FIG. 2] to [ii] the phase and/or frequency detector in the PLL).

In the present invention, the programmable delay circuit may be conventional, and may comprise a plurality of parallel gates, switches or transistors, each receiving a common input from the delay path, configured to select one of a plurality of signal transmission paths coupled to the parallel gates, switches or transistors. The programmable delay circuit may further comprise a second plurality of parallel gates, switches or transistors, coupling the outputs of the signal transmission paths to the delay path.

Each of the signal transmission paths may independently have a unique and/or characteristic signal transmission time, which may be determined by one or more delay elements in the path. Delay elements may include a resistor, a resistively-configured transistor (e.g., having its gate coupled to a voltage supply such as Vcc, Vss or ground, and having dimensions providing a characteristic resistance), a diode-configured transistor (e.g., wherein the gate and one source/drain terminal are commonly coupled to the input node), or a series of 2n inverters, where n is an integer of 1 or more. Preferably, one of the signal transmission paths does not contain a delay element. Examples of such circuits may be found in U.S. Ser. Nos. 08/897,375 and 08/932,315, of which the relevant portion(s) of each are incorporated herein by reference.

The feedback delay block (e.g., DL2) may cause the feedback input to the PFD (Phase/Frequency Detector) to lag behind a reference input. Thus, the PLL may compensate for the resulting phase difference by making the output of the VCO lead the reference input. Hence, in this manner, programming a predetermined delay value into the feedback delay block can eliminate one or more delays (e.g., from T1–T6 above).

The reference delay block (e.g., DL1) may act as a "fine-tuning knob," providing a secondary level of control over output delay. In conjunction with the feedback delay block, the programmable reference delay circuit forms the second half of a "Differential Delay Control" (DDC) circuit and scheme. The reference delay may (and preferably does) have the opposite effect of the feedback delay in this embodiment. Therefore, if the time increments of delay in the programmable feedback delay circuit are not fine enough, the reference delay can be used to compensate for the feedback delay. This may be implementation-dependent. In other words, the feedback delay can be a coarse delay tuner, and the reference delay can be a fine delay tuner, or vice-versa. Additionally, if these delay blocks are configurable through serial programming of configuration bits, then the user can dynamically fine-tune the PLL for their particular application.

The reference delay may also provide fixed and/or predictable input-output delay. In this case, the value programmed into the reference delay will be greater than the value programmed into the feedback delay by the amount of delay that the user wants through the device. The value programmed into the feedback delay should be dependent on the delays T1–T6 for which one wishes to compensate.

(2) Feedback from Beyond the Multiplexer:

In this case, if the feedback path to the PLL originates (directly or indirectly [e.g., after passing through one or more logic gates]) from the output of a multiplexer receiving a plurality of oscillator or PLL outputs, then the feedback delay block may automatically compensate for the delay through the post divider and the multiplexer. In this case, the programmable delays in the reference delay path and the feedback delay path may be programmed to different values.

A logic block may be configured to control the delay blocks and configure the feedback path (e.g., select its input or source). The logic circuitry and configuration bits in the logic block can be one-time programmable (e.g., using EPROM, ROM, fuses, or metal-masks), or serially programmable through IC input pins or programming hardware input pins. In the first case, the delay may not controlled by the user unless one builds field programming capability into the part. If the delay blocks and feedback path source are controllable through serially downloadable data words, then the user may have some adjustability and/or configurability in fine-tuning a system (e.g., a circuit board) containing the present clock circuit.

In either case, the user may estimate delays T1–T6, and calculate the compensation provided by the reference delay, the feedback delay, and the feedback path, using empirical formulae determined in accordance with techniques and/or procedures known to those skilled in the art.

One may alternatively implement the inventive concept (e.g., programmable delay blocks in feedback and/or reference input paths) in a ring oscillator or delay-locked loop circuit.

One may omit the reference and feedback counters, although they are preferably used for their conventionally-intended purposes. Optionally, the order of the counter and the programmable delay may be reversed (i.e., the programmable delay may receive the feedback or reference path input and the counter may receive the programmable delay output).

Configuration bits may be stored in flash memory, random access memory (RAM, which may be static or dynamic), or a plurality of registers. When the configuration bits are stored in flash memory, EPROM or EEPROM, they may be reprogrammed while the clock circuit is in place in the system or board.

The divider circuit may divide the oscillator or loop output by any integer, including one, and may comprise a series of such dividers. The divider circuit may further include a multiplier circuit that may multiply the oscillator or loop output by any integer, including one. The divider(s) and multiplier may be in any series order and/or in parallel to permit selection of a single such function or any combination thereof.

The present invention may provide an end user with control over the input-output phase relationship of a clock device using programmable delays in reference and/or feedback paths that are easy to implement in conventional oscillator and locked-loop circuits.

While the invention has been particularly shown and described with reference to the preferred embodiments thereof, it will be understood by those skilled in the art that various changes in form and details may be made without departing from the spirit and scope of the invention.

What is claimed is:

1. A clock circuit, comprising:

an oscillator, having a reference input receiving a reference signal, a feedback input receiving a feedback signal, and an output;

a reference path providing said reference signal from a reference clock input; and a feedback path providing said feedback signal from the oscillator output;

wherein each of the reference path and the feedback path comprises a programmable delay circuit.

2. The circuit according to claim 1, further comprising a logic circuit configured to select a characteristic or predetermined delay for the programmable delay circuit.

3. The circuit according to claim 2, further comprising a divider configured to provide a divided output from the oscillator output.

4. The circuit according to claim 1, further comprising:

a second oscillator configured to provide a second output; and a multiplexer configured to select one of the oscillator outputs as a clock output.

5. The circuit according to claim 3, wherein the logic circuit is further configured to select an input for the feedback path from at least two of the oscillator output, the divided output, and the clock output.

6. The circuit according to claim 5, wherein the reference path further comprises a reference counter receiving the reference clock input providing said reference signal therefrom, and the feedback path further comprises a feedback counter receiving the feedback path input providing said feedback signal therefrom.

7. A circuit comprising:

means for generating an output in response to (i) a reference input receiving a reference signal and (ii) a feedback input receiving a feedback signal;

means for generating said reference signal from a reference clock input; and means for generating said feedback signal from the output, wherein each of the reference path and the feedback path comprises a programmable delay circuit.

8. A method of controlling a clock output, comprising the steps of:

generating the clock output in response to a reference input and a feedback input; and delaying each of the reference input and the feedback input by a programmable amount of time to thereby control the clock output.

9. The method according to claim 8, further comprising the step of programming one or more programmable elements controlling the programmable amount of time.

10. The circuit according to claim 1, wherein said clock circuit comprises a phase locked loop.

11. The circuit according to claim 1, wherein said clock circuit comprises a delayed-lock loop.

12. The circuit according to claim 1, wherein said oscillator comprises a ring oscillator.

13. The circuit according to claim 4, wherein said second oscillator further comprises a phase locked loop.

14. The method according to claim 8, wherein said clock output is generated by a phase locked loop.

15. The method according to claim 8, wherein said clock output is generated by a delayed-lock loop.

16. The method according to claim 8, wherein said clock output is generated by a ring oscillator.

17. The method according to claim 8, wherein said method further comprises the step of:

producing a divided output from an oscillator output.

18. The method according to claim 17, wherein said method further comprises the steps of:

generating a second oscillator output; and selecting one of the oscillator outputs as said clock output.

19. The method according to claim 18, wherein said wherein said method further comprises the steps of:

selecting a characteristic or predetermined delay for the programmable amount of time; and selecting an input for a feedback path from at least two of (i) one of the oscillator outputs, (ii) the divided output, and (iii) the clock output.

20. The method according to claim 19, wherein said method further comprises the steps of:

providing a reference signal generated by a reference counter receiving the reference input; and providing a feedback signal generated by a feedback counter receiving the feedback path input.

* * * * *